(12) United States Patent
Van De Vall et al.

(10) Patent No.: US 6,701,610 B1
(45) Date of Patent: Mar. 9, 2004

(54) PICK AND PLACE MACHINE WITH VARIED NOZZLE LENGTHS

(75) Inventors: Leopold B. A. Van De Vall, Alpharetta, GA (US); Rudolph A. J. Born, Eindhoven (NL); Anne Elizabeth Barschall, Tarrytown, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/123,794

(22) Filed: Jul. 28, 1998

(51) Int. Cl.[7] ............... B23P 19/00; H01R 19/00
(52) U.S. Cl. ............... 29/740; 29/741; 29/739; 29/743; 29/729; 29/757
(58) Field of Search ............ 29/740, 741, 830, 29/831, 832, 739, 743, 834, 836, 837, 842, 846, 700, 709, 711, 712, 714, 729, 742, 757; 294/2, 64.1

(56) References Cited

U.S. PATENT DOCUMENTS

| | | | | |
|---|---|---|---|---|
| 4,769,904 A | * | 9/1988 | Porterfield et al. | 29/840 |
| 4,858,308 A | * | 8/1989 | Komori | 29/740 X |
| 4,914,809 A | * | 4/1990 | Fukai et al. | 29/740 X |
| 4,915,565 A | * | 4/1990 | Bond et al. | 414/225 X |
| 5,060,366 A | * | 10/1991 | Asai et al. | 29/739 X |
| 5,070,598 A | * | 12/1991 | Itagaki et al. | 29/705 X |
| 5,570,993 A | * | 11/1996 | Onodera et al. | 414/783 X |
| 5,778,524 A | * | 7/1998 | Stridsberg | 29/836 |
| 5,809,639 A | * | 9/1998 | Alvite | 29/740 X |
| 5,867,897 A | * | 2/1999 | Mimura et al. | 29/840 X |
| 5,870,820 A | * | 2/1999 | Arakawa et al. | 29/740 X |
| 5,953,812 A | * | 9/1999 | Ferrante | 29/714 X |
| 6,000,523 A | * | 12/1999 | Asai et al. | 198/377.08 X |

FOREIGN PATENT DOCUMENTS

| | | |
|---|---|---|
| JP | 04291794 | 10/1997 |
| WO | 9720455 | 6/1997 |

OTHER PUBLICATIONS

"Topaz–Specifications" Philips Electronics Manufacturing Technology B.V . (10/97).

\* cited by examiner

Primary Examiner—Teresa Walberg
Assistant Examiner—Binh-An D. Nguyen

(57) ABSTRACT

A beam configured pick and place machine has nozzles of differing lengths for carrying large components simultaneously.

17 Claims, 4 Drawing Sheets

NOZZLE POSITIONS
SHORT NOZZLES : 2,4,6 & 8
LONG NOZZLES : 1,3,5 & 7

PICK AND PLACE MACHINE WITH VARIED NOZZLE LENGTHS

BACKGROUND OF THE INVENTION

A. Field of the Invention

The invention relates to the field of pick and place machines such as are used to place components on a printed circuit board ("PCB") in a manufacturing context. The invention relates more particularly to increasing the number of components that can be picked and placed in one placement cycle.

B. Related Art

Currently there are several types of component placement machines. Some have a single placement head and some have several placement heads. The placement heads may be disposed in a turret configuration or in a line, also called a "beam". The turret configuration typically includes multiple heads arranged around a circle.

The Philips Topaz is an existing component placement machine that has eight placement heads arranged in a beam. The placement heads are 16 mm apart. Each placement head includes a nozzle for holding a component in place by suction.

The standard Topaz can bring eight small parts from the pick to the place area in one pick & place cycle, by allowing a "pay load" of eight parts per beam. For the purposes of this application, a "large" part is one which has at least one horizontal dimension greater than 12 mm. When large parts have to be turned in order to be placed, or when large parts exceed 12 mm in all horizontal dimensions, a problem arises. Namely two such parts cannot be placed on adjacent nozzles without a collision occurring between the parts.

Parts which are larger than 12 mm include DRAM chips commonly used for SIMM (Single In-line Memory Modules) boards. Such chips are commonly 18–22 mm in their larger horizontal dimension. FIG. 1 shows a typical arrangement of DRAM chips as they come from their manufacturer. The chips 102 come arranged like chocolates in a tray 103. Their first pin 101 has a known orientation in the tray, with all chips arranged in the same orientation.

The SIMM board 201, on which the DRAM chips are to be placed, is commonly oblong, as shown in FIG. 2. Depending on the layout envisioned by the board designer, the chips 102 may have any orientation when placed. For instance, a chip might be rotated by 90 degrees as shown at 202 or by 270 degrees as shown at 203. The pins 101 are shown with their different positions depending on the placement of their respective chips on the board.

When such larger parts are to be placed, the PCB manufacturer currently only uses alternate heads on a beam configuration machine to allow for the rotation required by a layout such as shown on FIG. 2. FIG. 3 shows a prior art beam configured pick and place machine 301 with 8 nozzles 302, like the Philips Topaz. When carrying the larger chips 102, half of the nozzles are empty. When only alternate heads are used, an eight head beam machine becomes no more effective than a four-headed machine. The enhanced component placement speed normally expected from having eight heads instead of four heads is lost.

However, spacing the eight heads farther from each other is not a viable option, because then component placement efficiencies would be lost for smaller components and a much larger and costlier frame design would be needed to allow all heads to reach all component pick-up locations.

SUMMARY OF THE INVENTION

The object of the invention is to create a beam configuration pick and place machine which is suitable for placing both large and small electronic components and also can carry larger components on all of its placement heads simultaneously.

This object is achieved by using nozzles of differing lengths in the beam configuration pick and place machine.

BRIEF DESCRIPTION OF THE DRAWING

The invention will now be described by way of non-limitative example with reference to the following drawings.

DETAILED DESCRIPTION OF THE PREFERRED EMBODIMENTS

Figure 1:
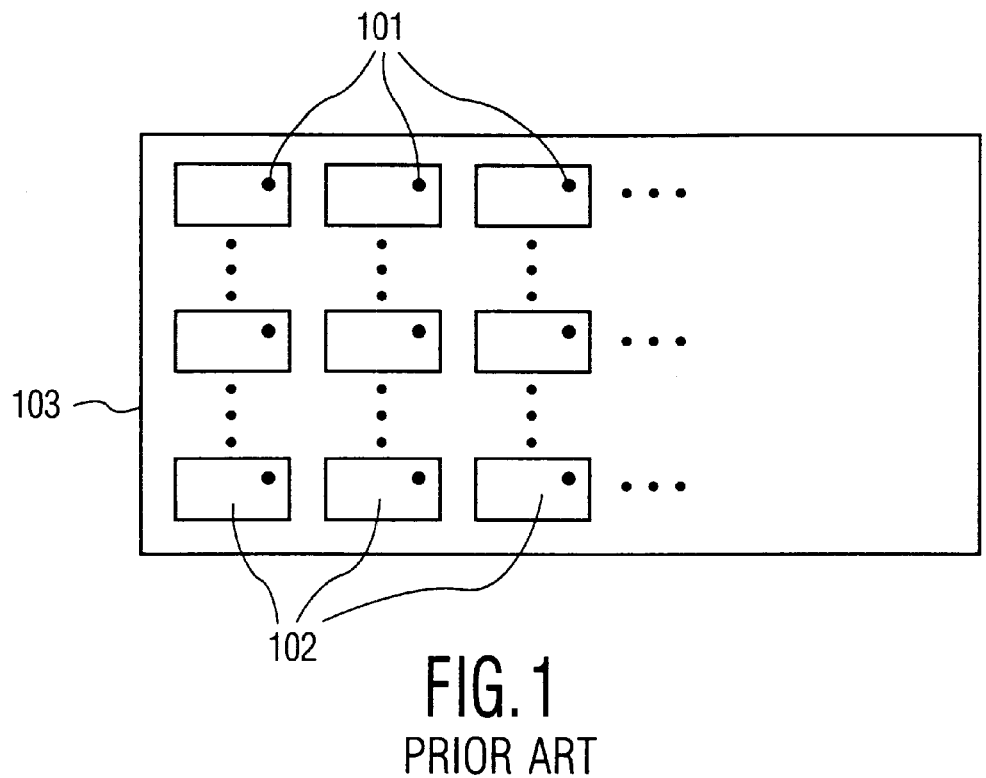
FIG. 1 shows how "large" components come from their manufacturer.
Figure 2:
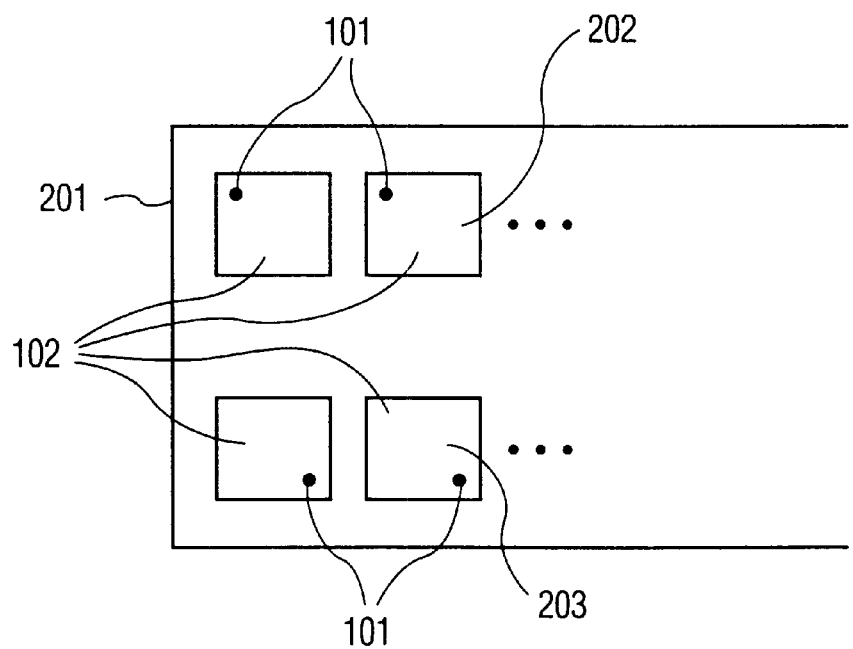
FIG. 2 shows a possible layout for the large components on a PCB.
Figure 3:
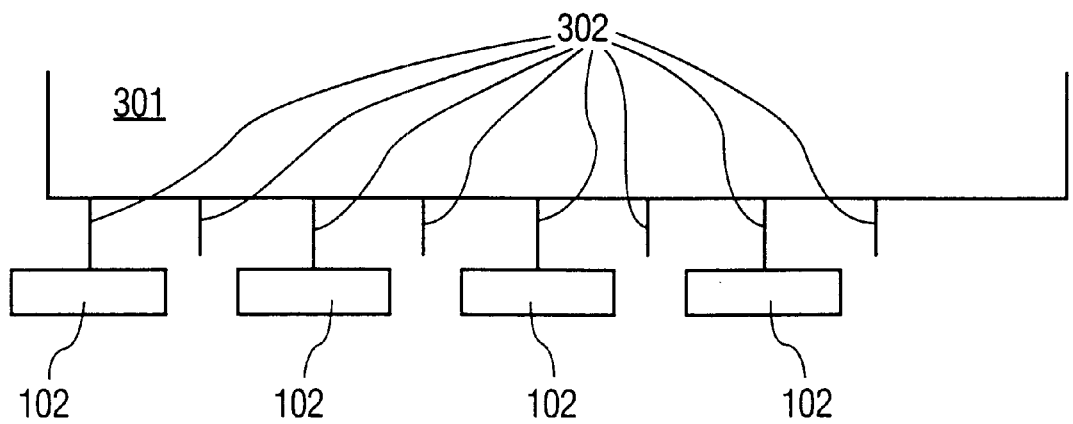
FIG. 3 shows a prior art pick and place machine carrying large components.
Figure 4:
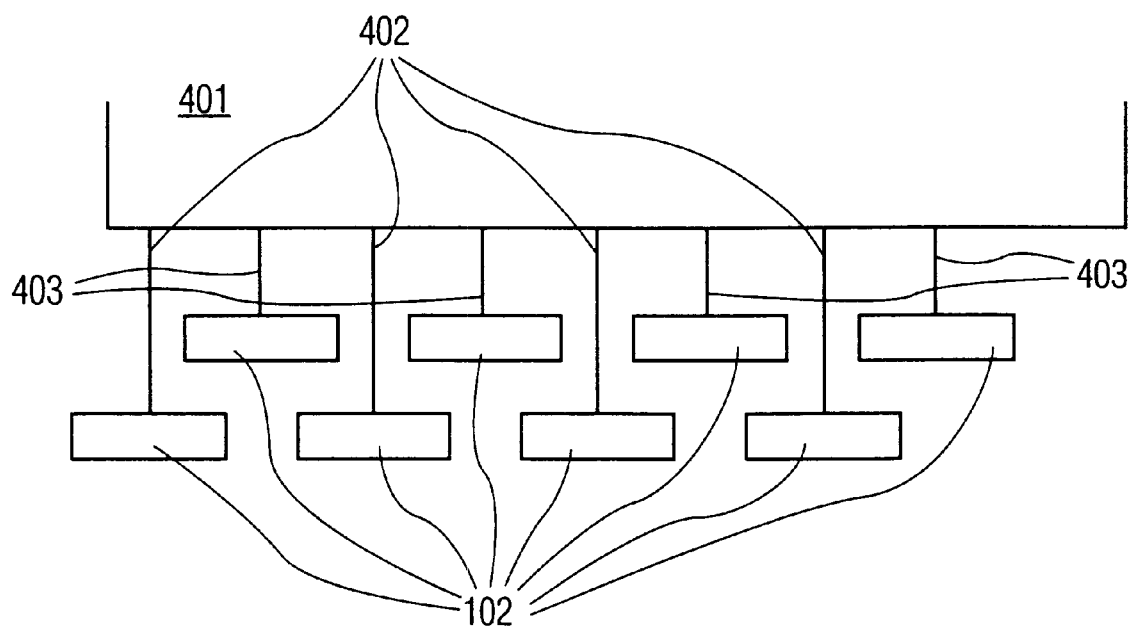
FIG. 4 shows a portion of the pick and place machine in accordance with the invention.

FIG. 4 shows a pick and place machine 401 in accordance with the invention. This machine has nozzles of differing lengths. Nozzles 402 are longer than nozzles 403. As a result the chips 102 are carried at different heights. Consequently, each chip experiences at least a 32 mm clearance between nozzles, rather than a 16 mm clearance as shown in the prior art. Nevertheless, the nozzles are actually 16 mm apart at their bases and can therefore be used effectively for small component placement.

Herein the pick and place machine has been described as carrying components using a nozzle. However the invention is equally applicable to pick and place machines using other mechanisms such as grippers to pick up components. The invention is shown with the nozzles oriented vertically, but the principle of the invention would be equally applicable to other machines, for instance machines with horizontal nozzles.

Figure 5:
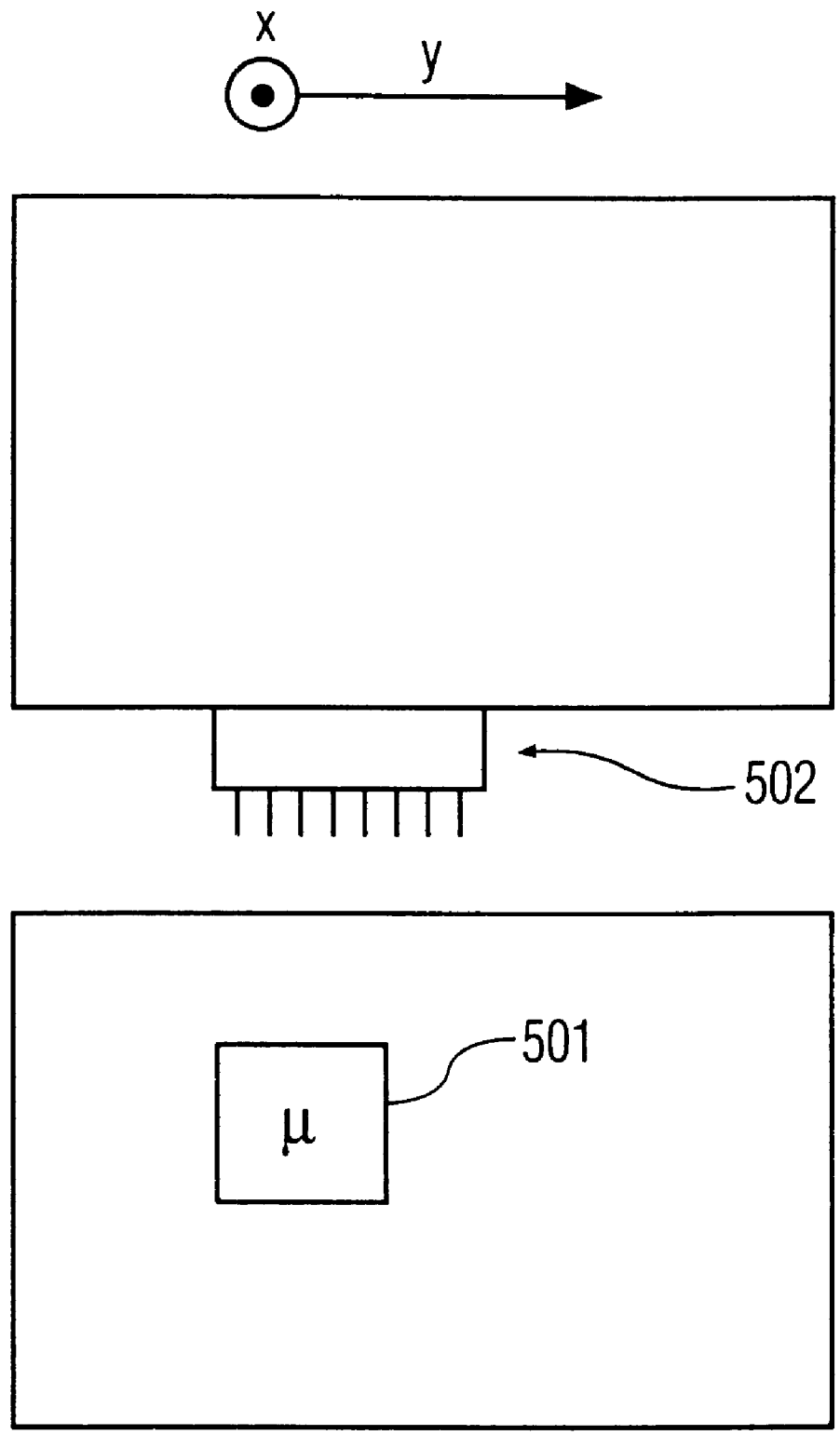
FIG. 5 shows a full view of the pick and place machine of FIG. 4.

FIG. 5 shows a more complete view of the pick and place machine including a processor 501 for controlling movement of the heads 502. The direction Y shows the direction of the beam, while the direction X, into the paper, shows the direction of motion of the beam.

Figure 6A:
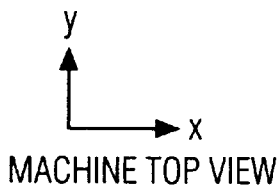
FIG. 6a shows an abstract view of the motion of the beam of a beam configuration pick and place machine.

FIG. 6a shows an abstracted view of the pick and place machine. The beam is parallel to the Y axis and moves parallel to the axis X. A largest component to be placed has a current dimension L in the direction Y. A distance $Y_1$ is taken to be a bit less than the distance between adjacent nozzles in the beam. For instance, with the Topaz, the nozzles are 16 mm apart, but $Y_1$ is preferably 12 mm.

The nozzles of the invention have the advantage of being able to use of much existing software on the pick and place machines. The higher carried parts have to be picked up first and the lower carried parts have to be placed first. Existing software on such pick and place machines is able to sequence pick up and placement. The sequencing does not result in substantial time loss, because commonly the machine needs to move between pickups and placements.

Figure 6B:
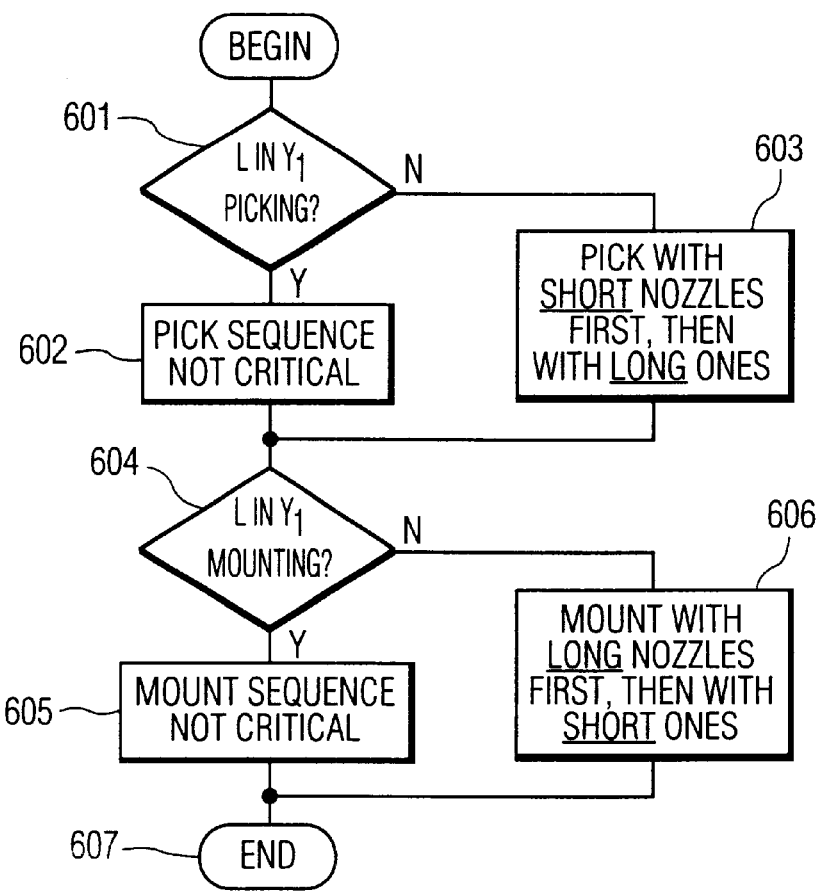
FIG. 6b is a flowchart.

FIG. 6b is a flowchart showing a slight modification of the control software needed to handle sequencing with the nozzles of the invention. In this flowchart, at box 601 it is tested whether any current dimension L is less than $Y_1$, if so, the picking sequence is not critical and control passes to box 602. If L is greater than $Y_1$, then control passes to box 603 where the machine is instructed to pick up with the short nozzles first and then with the long ones.

At 604 it is tested whether the largest component length in the Y direction is less than $Y_1$, for mounting. Of course, some components may have been rotated, so the current largest dimension L in the Y direction may not be the same as it was for pickup. Moreover, the current largest dimension L in the Y direction may not be on the same component as it was for pickup.

If the current largest dimension L is less than $Y_1$ for mounting, then the mount sequence is not critical, and control passes to 605. On the other hand, if L is not less than $Y_1$ for mounting, then at 606 the components on the long nozzles are mounted prior to the components on the short nozzles. Control passes to 607 after both 605 and 606.

Figure 6C:
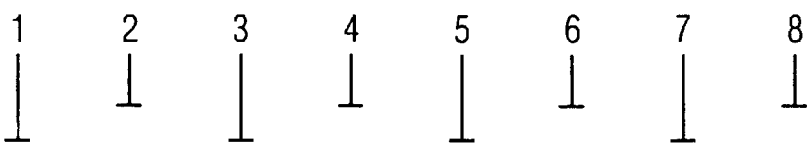
FIG. 6c shows a numbering scheme for the heads in accordance with the invention.

FIG. 6c shows a numbering scheme for the nozzles, with the short nozzles being numbered 2, 4, 6, & 8 and the long nozzles being numbered 1, 3, 5, & 7.

In addition the software needs to be accommodated to give a greater travel distance for the short nozzles than for the long nozzles and this is done in the vision file.

What is claimed is:

1. A pick and place machine for mounting a plurality of components on a printed circuit board, said pick and place machine comprising:

a first plurality of heads movable between a component storage location and a component placement location;

a second plurality of heads movable between the component storage location and the component placement location; and a controller in electrical communication with said first plurality of heads and said second plurality of heads to control a movement of said first plurality of heads and said second plurality of heads between the component storage location and the component placement location, wherein, when said first plurality of heads and said second plurality of beads are concurrently located at the component storage location, said controller is operable to execute a component pickup sequence including a fist picking up of a first subset of the plurality of components by said first plurality of heads, and a second picking up of a second subset of the plurality of components by said second plurality of heads subsequent to the fir picking up of the first subset of the plurality of components by said first plurality of heads to thereby avoid any pickup collision involving the first subset of the plurality of components and the second subset of the plurality of components.

2. The pick and place machine of claim 1, wherein said controller is operable to selectively execute the component pickup sequence as a function of at least one dimension of The plurality of components.

3. The pick and place machine of claim 1, wherein, when said first plurality of heads and said second plurality of heads are concurrently located at the component placement location, said controller is further operable to execute a component mounting sequence including a first mounting of the first subset of the plurality of components onto the printed circuit board by said first plurality of heads, and a second mounting of the second subset of the plurality of components onto the printed circuit board by said second plurality of heads subsequent to the first mounting up of the first subset of the plurality of components onto the printed circuit board by said first plurality of heads to thereby avoid any mounting collision involving the first subset of the plurality of components and the second subset of the plurality of components.

4. The pick and place machine of claim 3, wherein said controller is further operable to selectively execute the component mounting sequence as a function of at least one dimension of the plurality of components.

5. The pick and place machine of claim 1, wherein said controller is further operable to set said first plurality of heads in a first position and said second plurality of heads in a second position when concurrently moving said second plurality of heads from the component storage location to the component placement location; and wherein a position differential between the first pickup position and the second pickup position impedes any transporting collision between the first subset of the plurality of components and the second subset of the plurality of components.

6. The pick and place machine of claim 1, wherein each head of said first plurality of heads includes a nozzle.

7. The pick and place machine of claim 1, wherein each head of said second plurality of heads includes a nozzle.

8. A pick and place machine for mounting a plurality of components on a printed circuit board, said pick and place machine comprising:

a first plurality of heads movable to a component storage location;

a second plurality of heads movable to the component storage location; and a controller in electrical communication with said first plurality of heads and said second plurality of heads to control a movement of said first plurality of heads and said second plurality of heads to the component storage location, wherein, when said first plurality of heads and said second plurality of heads are concurrently located at the component storage location, said controller is operable to execute a component pickup sequence including a first picking up of a first subset of the plurality of components by said first plurality of heads, and a second picking up of a second subset of the plurality of components by said second plurality of heads subsequent to the first picking up of the first subset of the plurality of components by said first plurality of heads to thereby avoid any pickup collision involving the first subset of the plurality of components and the second subset of the plurality of components.

9. The pick and place machine of claim 8, wherein said controller is operable to selectively execute the component pickup sequence as a function of at least one dimension of the plurality of components.

10. The pick and place machine of claim 8,
wherein said controller is further operable to set said first plurality of beads in a first position and said second plurality of heads in a second position when concurrently moving said second plurality of heads from the component storage location to a component placement location; and wherein a position differential between the first pickup position and the second pickup position impedes any transporting collision between the first subset of the plurality of components and the second subset of the plurality of components.

11. The pick and place machine of claim 8, wherein each head of said firs plurality of heads includes a nozzle.

12. The pick and place machine of claim 8, wherein each head of said second plurality of heads includes a nozzle.

13. A pick and place machine for mounting a plurality of components on a printed circuit board, said pick and place machine comprising:
- a first plurality of heads movable to a component placement location;
- a second plurality of heads movable to the component placement location; and
- a controller in electrical communication with said first plurality of heads and said second plurality of heads to control a movement of said first plurality of heads and said second plurality of heads to the component placement location,
  - wherein, when said first plurality of heads and said second plurality of heads are concurrently located at the component placement location, said controller is further operable to execute a component mounting sequence including
    - a first mounting of the first subset of the plurality of components onto the printed circuit board by said first plurality of heads, and
    - a second mounting of the second subset of the plurality of components onto the printed circuit board by said second plurality of heads subsequent to the first mounting up of the first subset of the plurality of components onto the printed circuit board by said fist plurality of heads to thereby avoid any mounting collision involving the first subset of the plurality of components and the second subset of the plurality of components.

14. The pick and place machine of claim 13, wherein said controller is further operable to selectively execute the component mounting sequence as a function of at least one dimension of the plurality of components.

15. The pick and place machine of claim 13,
wherein said controller is further operable set said first plurality of heads in a first position and said second plurality of heads in a second position when concurrently moving said second plurality of heads from a component storage location to the component placement location; and wherein a position differential between the first pickup position and the second pickup position impedes any transporting collision between the first subset of the plurality of components and the second subset of the plurality of components.

16. The pick and place machine of claim 13, wherein each head of said first plurality of heads includes a nozzle.

17. The pick and place machine of claim 13, wherein each head of said second plurality of heads includes a nozzle.

* * * * *